United States Patent [19]

Narita

[11] Patent Number: 4,985,372

[45] Date of Patent: Jan. 15, 1991

[54] METHOD OF FORMING CONDUCTIVE LAYER INCLUDING REMOVAL OF NATIVE OXIDE

[75] Inventor: Tomonori Narita, Tokyo, Japan

[73] Assignee: Tokyo Electron Limited, Tokyo, Japan

[21] Appl. No.: 477,506

[22] Filed: Feb. 9, 1990

[30] Foreign Application Priority Data

Feb. 17, 1989 [JP] Japan ................................ 1-37717

[51] Int. Cl.$^5$ ................... H01L 21/283; H01L 21/336
[52] U.S. Cl. ................................... 437/192; 437/245;
437/946; 437/949; 437/41; 437/193; 437/200;
148/DIG. 17; 148/DIG 6
[58] Field of Search ............... 437/200, 192, 935, 245,
437/946, 949, 41, 193; 148/DIG. 17, DIG. 18,
DIG. 19, DIG. 147, DIG. 6, DIG. 22;
156/345, 643, 662.1; 204/192.1, 192.23; 357/65,
67, 71

[56] References Cited

U.S. PATENT DOCUMENTS

| 4,517,225 | 5/1985 | Broadbent | 437/245 |
| 4,545,115 | 10/1985 | Bauer et al. | 148/DIG. 19 |
| 4,585,517 | 4/1986 | Stemple | 437/946 |
| 4,605,479 | 8/1986 | Faith, Jr. | 204/192.23 |
| 4,617,087 | 10/1986 | Iyer et al. | 156/643 |
| 4,619,038 | 10/1986 | Pintchovski | 148/DIG. 147 |
| 4,622,735 | 11/1986 | Shibata | 148/DIG. 147 |
| 4,629,635 | 12/1986 | Brors | 437/192 |
| 4,647,361 | 3/1987 | Bauer | 148/DIG. 17 |
| 4,918,033 | 4/1990 | Bartha et al. | 437/245 |

FOREIGN PATENT DOCUMENTS

0157502 10/1985 European Pat. Off. ... 148/DIG. 147

OTHER PUBLICATIONS

Locker, L. D. et al. "Reaction Kinetics . . . ", *J. Appl. Phys.*, vol. 44, No. 10, Oct. 1973, pp. 4366-4369.
Wolf, S. et al., Silicon Processing, Lattice Press, 1986, pp. 384-405.

*Primary Examiner*—Olik Chaudhuri
*Assistant Examiner*—T. N. Quach
*Attorney, Agent, or Firm*—Oblon, Spivak, McClelland, Maier & Neustadt

[57] ABSTRACT

A method of forming a conductive layr includes the steps of performing dry etching of a surface of a substrate in a first chamber maintained in a nonoxidizing atmosphere to remove a natural oxide from the surface of the substrate, transferring the substrate from the first chamber to a second chamber while the nonoxidizing atmosphere is maintained, and forming a refractory metal film on the surface of the substrate by low-pressure CVD in the second chamber.

9 Claims, 6 Drawing Sheets

METHOD OF FORMING CONDUCTIVE LAYER INCLUDING REMOVAL OF NATIVE OXIDE

BACKGROUND OF THE INVENTION

1. Field of the Invention

The present invention relates to a method of forming a conductive layer and, more particularly, to a selective deposition process using a plasma.

2. Description of the Related Art

In resent years, along development of a highly integrated, high-speed, high-density circuit such as ultra LSIs (large scaled integrated circuit), in order to form a gate electrode and to deposit a conductive material into a contact hole or a through hole, a technique for selectively depositing a refractory metal such as W (tungsten) having a low resistance 1/10 or less that of polycrystalline silicon has received a great deal of attention.

As a means for forming a thin metal film by selective deposition, a CVD (chemical vapor deposition) apparatus is available. In the CVD apparatus, a substrate is rapidly heated with infrared rays in order to maintain its selectivity, and a film is grown on the surface of the substrate by a film forming gas.

In formation of a thin metal film by using the CVD apparatus, when a substrate to be treated such as a silicon wafer is transferred from a previous step to the CVD apparatus, a natural oxide ($SiO_2$) film having a thickness of, e.g., several tens of Å is formed on the surface of a silicon wafer. When a thin metal film is formed on the silicon wafer on which the natural oxide film is formed, a contact resistance between the silicon wafer and the thin metal film is increased, and the thin metal film is peeled from the silicon wafer, thus degrading the quality of the semiconductor device.

In order to prevent this and improve the quality of the semiconductor device, the natural oxide film on the surface of the silicon wafer is removed by dry etching, and then a CVD process may be performed.

When this dry etching and CVD process are performed in the same chamber, the following problem is posed.

A plasma generating electrode for etching must be arranged in the CVD apparatus. However, a heavy metal such as Fe may be released from the plasma generating electrode during etching. This heavy metal contaminates a gate electrode or a diffusion region and causes degradation of device performance.

During etching, the silicon wafer may be damaged by plasma ion bombardment on the surface of the silicon wafer. In order to prevent this, the silicon wafer must be protected against the plasma. For this purpose, the structure of the chamber must be modified.

Conventional techniques concerning the modifications of the structure of the chamber are described in Published Unexamined Japanese Patent Application Nos. 60-221572, 60-238134, 61-95887, 61-231166, 62-213112, 62-250652 and the like. These prior art applications disclose a combination of a vacuum chamber and another chamber. However, no description is made about removal the natural oxide by dry etching from the surface of a silicon wafer and performance of a subsequent CVD process.

SUMMARY OF THE INVENTION

It is an object of the present invention to provide a method of forming a conductive layer to allow manufacture of a high-performance semiconductor device without causing contamination of a gate electrode and diffusion region by a heavy metal from the electrode and damage to a substrate by ion bombardment.

It is another object of the present invention to provide a method of forming a gate electrode of a high-performance MOS type semiconductor device to allow effective removal of a natural oxide film from a substrate surface without causing contamination of the gate electrode and diffusion region by a heavy metal from the electrode and damage to a substrate by ion bombardment.

It is still another object of the present invention to provide a method of forming a contact for a diffusion region of a high-performance semiconductor device to allow effective removal of a natural oxide film from a substrate surface without causing contamination of a gate electrode and diffusion region by a heavy metal from the electrode and damage to a substrate by ion bombardment.

According to the present invention, there is provided a method of forming a conductive layer, comprising the steps of performing dry etching of a surface of a substrate in a first chamber maintained in a nonoxidizing atmosphere to remove a natural oxide from the surface of the substrate, transferring the substrate from the first chamber to a second chamber while the nonoxidizing atmosphere is maintained, and forming a refractory metal film on the surface of the substrate by low-pressure CVD in the second chamber.

According to the present invention, there is provided a method of forming a gate electrode of a MOS type semiconductor device, comprising the steps of forming a gate oxide film on a surface of a semiconductor substrate, forming a polycrystalline silicon layer on the gate oxide film, performing dry etching of the surface of the polycrystalline silicon layer in a first chamber maintained in a nonoxidizing atmosphere to remove a natural oxide from the surface of the polycrystalline silicon layer, transferring the substrate from the first chamber to a second chamber while the nonoxidizing atmosphere is maintained, forming a refractory metal silicide layer on the surface of the polycrystalline silicon layer by low-pressure CVD in the second chamber, and patterning the polycrystalline silicon layer and the refractory metal silicide layer to form a gate electrode consisting essentially of the polycrystalline silicon layer and the refractory metal silicide layer.

Furthermore, according to the present invention, there is provided a method of forming source and drain electrodes of a MOS type semiconductor device, comprising the steps of forming a gate oxide film and a gate electrode on a surface of a semiconductor substrate, forming source and drain regions by doping an impurity in the semiconductor substrate, performing dry etching of surfaces of the source and drain regions in a first chamber maintained in a nonoxidizing atmosphere to remove a natural oxide from the surfaces of the source and drain regions, transferring the substrate from the first chamber to a second chamber while the nonoxidizing atmosphere is maintained, and depositing a refractory metal on the surfaces of the source and drain regions by low-pressure CVD in the second chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

DETAILED DESCRIPTION OF THE PREFERRED EMBODIMENT

A case wherein the present invention is applied to formation of a refractory metal layer on a silicon wafer in the manufacturing process of semiconductor devices will be described.

Figure 1:
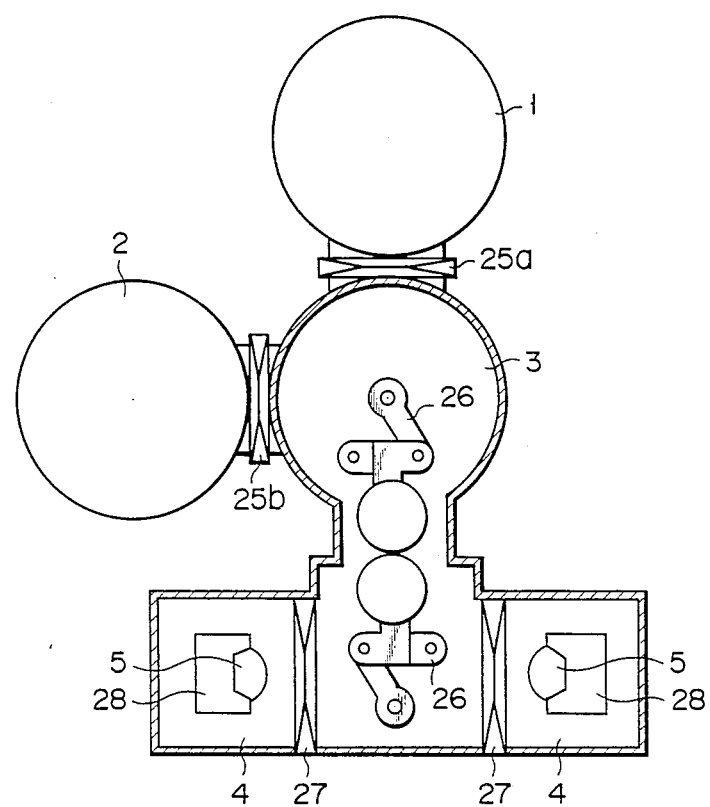
FIG. 1 is a sectional view showing an apparatus for practicing the method of the present invention.

FIG. 1 shows an apparatus used in the embodiment. This apparatus comprises a first chamber 1 for etching, a second chamber 2 for CVD, a transfer chamber 3 for transferring a substrate from the first chamber 1 to the second chamber 2, and a storage section 4 for storing the substrate.

Figure 2:
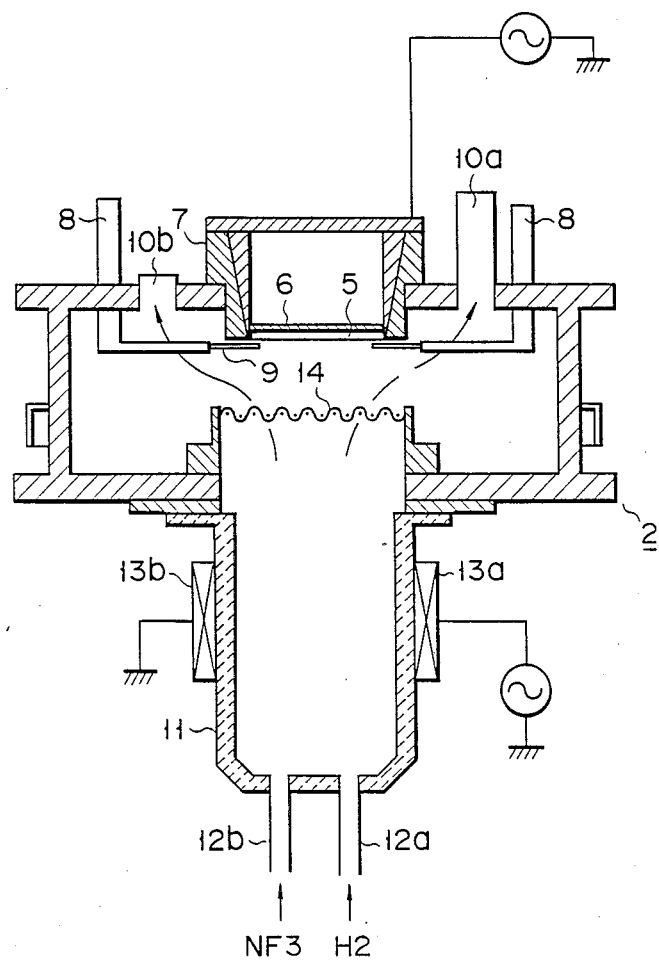
FIG. 2 is a sectional view showing an etching chamber constituting a part of the apparatus shown in FIG. 1.

The first chamber 1 is an airtight aluminum cylinder and its wall surface can be cooled by cooling water or the like, as shown in FIG. 2. A wafer mounting plate 6 is arranged at an upper portion of the first chamber 1. The silicon wafer can be mounted on the wafer mounting plate 6 such that its surface to be treated faces down. The surface of the wafer mounting plate 6 is made of anodized aluminum in order to prevent contamination by metals. The wafer mounting plate 6 is electrically connected to an RF source of, e.g., 13.56 MHz. A cooling mechanism (not shown) is arranged for the wafer mounting plate 6 so as to cool the mounting plate 6 to the same temperature as the wall surface of the first chamber 1.

The wafer mounting plate 6 is supported by a cylindrical support member 7 at its edge. A wafer supporting member 9 with a lift mechanism 8 such as an air cylinder is arranged near the wafer mounting plate 6. The edge of a wafer 5 is supported by the wafer supporting member 9 and fixed on the wafer mounting plate 6. In addition, two exhaust ports 10a and 10b are formed near the wafer mounting plate 6 to evacuate the first chamber 1. These exhaust ports 10a and 10b are connected to a vacuum pump such as a turbo molecular pump (not shown) so as to reduce a pressure of the first chamber 1 to a desired pressure and to exhaust a reaction gas.

Figure 4:
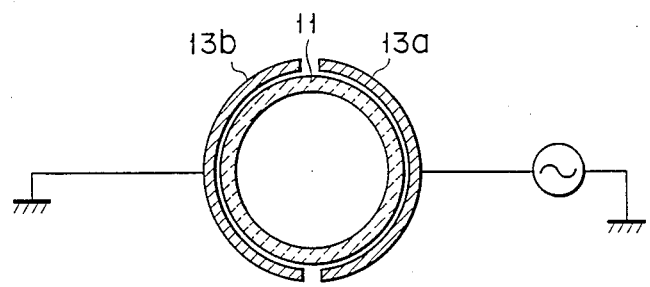
FIG. 4 is a view showing an arrangement of electrodes of the etching chamber shown in FIG. 2.

A cylindrical quartz chamber 11 having a bottom is arranged at a lower portion of the first chamber 1. Gas inlet pipes 12a and 12b are arranged on the bottom of the quartz chamber 11. The gas inlet pipes 12a and 12b are connected to a gas supply source through a flow rate controlling mechanism (not shown). A pair of plasma generating electrodes 13a and 13b oppose each other on the outer side surface of the quartz chamber 11 to excite an etching gas supplied into the quartz chamber 11 so as to generate a plasma. As shown in FIG. 4, the plasma generating electrodes 13a and 13b are semicylindrical members insulated from each other, and surround the quartz chamber 11. The plasma generating electrode 13a of the plasma generating electrodes 13a and 13b is connected to an RF source of, e.g., 13.56 MHz, and the plasma generating electrode 13b is grounded.

In order to prevent damage to the silicon wafer by ion bombardment, a mesh plate 14 is provided between the upper opening of the quartz chamber 11 and the mounting plate 6. This mesh plate 14 is formed by anodizing a mesh consisting of, e.g., an aluminum alloy. The first chamber 1 for removing a natural oxide film from the surface of the silicon wafer is constituted in this manner.

Figure 3:
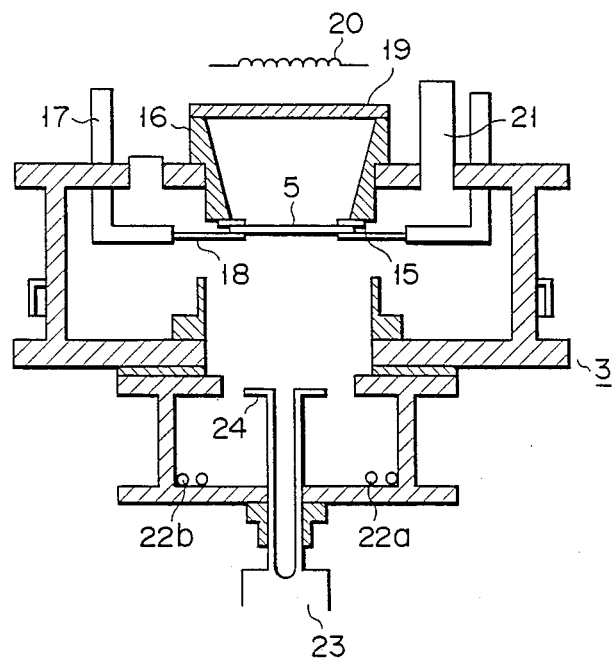
FIG. 3 is a sectional view showing a CVD chamber constituting a part of the apparatus shown in FIG. 1.

The second chamber 2 for depositing a refractory metal by CVD on a silicon wafer surface from which a natural oxide film is removed will be described. The second chamber 2 is an airtight aluminum cylinder and its wall surface can be cooled by a cooling water or the like, as shown in FIG. 3. A wafer mounting ring 15 is arranged at an upper portion of the second chamber 2. The silicon wafer can be mounted on the ring 15 such that its surface to be treated faces down. The wafer mounting ring 15 is supported at its edge by a support member 16.

A wafer supporting member 18 with a lift mechanism 17 such as an air cylinder is arranged near the wafer mounting ring 15. The wafer 5 is supported at its edge by the supporting member 18 and fixed on the wafer mounting ring 15. A halogen lamp 20 is arranged above the wafer mounting ring 15. The wafer 5 is rapidly heated to, e.g., 300 to 1,000° C. by the halogen lamp 20 through a window made of quartz glass.

At upper portions of the second chamber 2 and near the wafer mounting ring 15, for example, two exhaust ports 21a and 21b for evacuating the second chamber 2 are arranged. These exhaust ports 21a and 21b are connected to a vacuum pump such as a turbo molecular pump (not shown) so as to reduce a pressure of the second chamber 2 to a desired pressure and to exhaust a reaction gas.

Gas inlet ports 22a and 22b are formed on the bottom of the second chamber 2. These gas inlet ports 22a and 22b are constituted by a lot of small gas flow ports for supplying a deposition gas, a carrier gas, and an etching gas and the like. The gas inlet ports 22a and 22b are connected to a gas supply source through a flow rate controlling mechanism (not shown) such as a mass flow controller.

A disk-like control plate 24 having linearly movable moving mechanism such as a stepping motor is arranged between the wafer mounting ring 15 and the gas inlet ports 22 and 22b. The control plate 24 controls a gas flow supplied from the gas inlet ports 22a and 22b to the second chamber 2. The second chamber 2 is constituted in this manner.

As shown in FIG. 1, gate valves 25a and 25b are arranged on the sides of the first and second chambers 1 and 2, respectively. The gate valves 25a and 25b are automatically controlled to be opened/closed by a suitable means (not shown). The first and second chambers 1 and 2 are connected to the transfer chamber 3 through the gate valves 25a and 25b, respectively.

In order to load/unload the wafer 5 into/from the first and second chambers 1 and 2, for example, extendable and rotatable hand arms 26a and 26b are arranged in the transfer chamber 3. The transfer chamber 3 is connected to a vacuum pump (not shown) for reducing a pressure of the transfer chamber 3 to a desired pressure. The transfer chamber 3 is also connected to the storage section 4 for storing the silicon wafer 5 through gate valves 27a and 27b.

A mounting table (not shown) on which twenty-five silicon wafers 5 can be mounted with predetermined intervals is built in the storage section 4.

The apparatus for sequentially performing etching and CVD in a vacuum is arranged as described above. Note that an operation of the apparatus is controlled by a control mechanism (not shown).

Next, dry etching and CVD on the silicon wafer 5 using the apparatus shown in FIG. 1 and described above will be described.

When the gate valve 27a is opened, a predetermined silicon wafer 5 is picked out from a carrier 28 in the storage section 4 by a hand arm 26 of the transfer chamber 3 which is maintained at a pressure of $10^{-3}$ to $10^{-4}$ Torr in advance. In this case, the gate valves 25a and 25b are closed, and the first and second chambers 1 and 2 are maintained at a predetermined low pressure by a vacuum pump. Note that the gate valve 27a is automatically closed as the wafer is picked out.

Subsequently, the gate valve 25a of the first chamber 1 is opened, and the wafer 5 is loaded into the first chamber 1 by the hand arm 26. At this time, the wafer supporting member 9 is set at the lower position by the lift mechanism 8, and the wafer 5 is mounted on the wafer supporting member 9 such that the surface to be treated of the wafer 5 faces down. The wafer supporting member 9 is lifted by the lift mechanism 8, and the edge of the wafer 5 is clamped and fixed between the wafer mounting plate 6 and the wafer supporting member 9. Upon fixing the wafer 5 on the mounting plate 6, the arm 26 is stored in the transfer chamber 3, and the gate valve 25a is closed.

A cleaning treatment in which a natural oxide layer formed on the surface to be treated of the wafer 5 is removed by dry etching is performed.

The first chamber 1 is evacuated by a vacuum pump to be maintained at a predetermined low pressure, e.g., 200 mm Torr. An $H_2$ gas and an $NF_3$ gas are supplied from the gas inlet pipes 12a and 12b to the quartz chamber 11, respectively, while the flow rates of these gases are controlled by a flow rate control mechanism (not shown). At the same time, when an electric power of, e.g., several tens of W is applied to the electrode 13a, discharge is caused between the electrodes 13a and 13b to generate a gas plasma. The etchant obtained in this manner is supplied to the surface of the wafer 5 to etch the natural oxide layer on the surface of the wafer 5. The etching is performed for a predetermined period of time, e.g., 10 seconds, to accurately remove the natural oxide layer from the surface of the wafer 5. Note that an $N_2$ gas may be used in place of the $H_2$ gas.

Thereafter, the supply of the gases and discharge are stopped, the wafer 5 is transferred from the first chamber 1 to the second chamber 2 in a vacuum, in order to form a refractory metal by CVD on the surface to be treated of the wafer 5.

The gate valve 25a is opened, and the wafer 5 is transferred from the first chamber 1 to the transfer chamber 3. The gate valve 25a is closed, and the hand arm 26 is rotated by a predetermined angle. Thereafter, the gate valve 25b of the second chamber 2 is opened. The wafer 5 is loaded into the second chamber 2 by the hand arm 26.

In the second chamber 2, the wafer supporting member 18 is set at the lower position by the lift mechanism 17. The wafer 5 is mounted on the wafer supporting member 18 such that the surface to be treated of the wafer 5 faces down. Then, the wafer supporting member 18 is lifted by the lift mechanism 17. The wafer 5 is fixed on the wafer mounting ring 15 such that the peripheral portion of the wafer 5 is clamped between the wafer mounting ring 15 and the wafer supporting member 18. Upon fixing the wafer 5 on the wafer mounting ring 15, the hand arm 26 is stored in the transfer chamber 3, and the gate valve 25b is closed.

Thereafter, a refractory metal layer is formed by CVD on the surface to be treated of the wafer 5 in the following manner. The second chamber 2 is evacuated by a vacuum pump to be maintained at a predetermined low pressure, e.g., 100 to 200 mm Torr. The halogen lamp 20 illuminates the rear surface of the wafer 5 through a window made of quartz glass to rapidly heat the wafer 5. In this case, infrared rays from the wafer 5 are detected by using a pyrometer, or the temperature of the wafer 5 is directly detected by using a highly sensitive thermocouple, thereby controlling the temperature of the surface to be treated of the wafer 5 within a range of 40 to 530° C. Deposition gases such as $WF_6$ and $SiH_4$ and carrier gases such as $H_2$ and Ar are supplied from the gas inlet ports 22a and 22b to the second chamber 2, and CVD is performed. As a result, a metal such as W (tungsten) is selectively deposited in holes or the like formed on the surface to be treated of the wafer 5. As a metal to be deposited, not only W (tungsten) but WSi (tungsten silicide), polycrystalline silicon or the like can be used.

Upon completion of forming the desired metal layer, the supply of the reaction gases is stopped. The wafer supporting member 18 supporting the wafer 5 is moved downward, and the gate valve 25b is opened. The wafer 5 is unloaded from the second chamber 2 by the extendable and rotatable hand arm 26. At the same time, the gate valve 25b is closed, and the CVD process is completed.

Thereafter, whether a wafer to be treated is present in the carrier 28 or not is checked. When a wafer to be treated is present, the above dry etching and CVD are performed again. When no wafer to be etched is present, the entire operation is completed.

Figure 5:
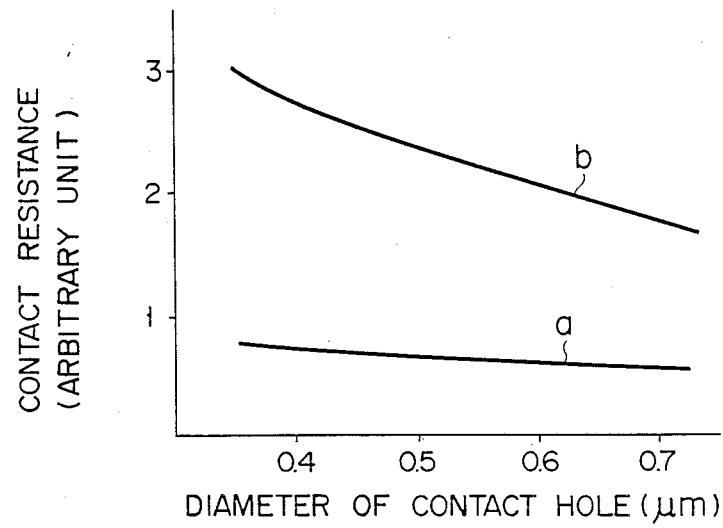
FIG. 5 is a graph showing changes in contact resistance as a function of the diameter of contact holes comparing a case when dry etching is performed with a case when dry etching is not performed.

FIG. 5 shows data of contact resistances comparing a case wherein W is selectively deposited in contact holes having various diameters by the described method with a case wherein dry etching is not performed. Referring FIG. 5, the curve a indicates a case wherein dry etching is performed according to the present invention, and the curve b indicates a case wherein dry etching is not performed. As is apparent from FIG. 5, according to the present invention, low contact resistances can be obtained regardless of the diameters of contact holes.

When dry etching is not performed, however, high contact resistances are obtained, and they are largely affected by the diameters of contact holes.

A case wherein a continuous process of dry etching and CVD described above is applied to formation of gate, source, and drain electrodes of a MOS transistor will be described.

FIGS. 6A to 6F are sectional views showing steps of manufacturing a MOS transistor. In this case, an apparatus shown in FIG. 7 is used as an apparatus for forming a gate electrode. This apparatus has an arrangement in which a third chamber 2' having the same structure as the second chamber 2 is mounted on the apparatus shown in FIG. 1 through a gate valve 25b'.

Figure 6A:
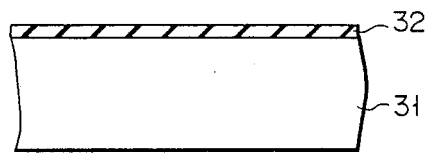
FIGS. 6A to 6F are sectional views showing manufacturing steps of a MOS transistor according to the present invention.
Figure 6B:
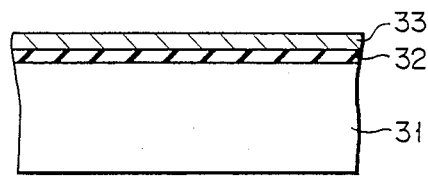
Figure 7:
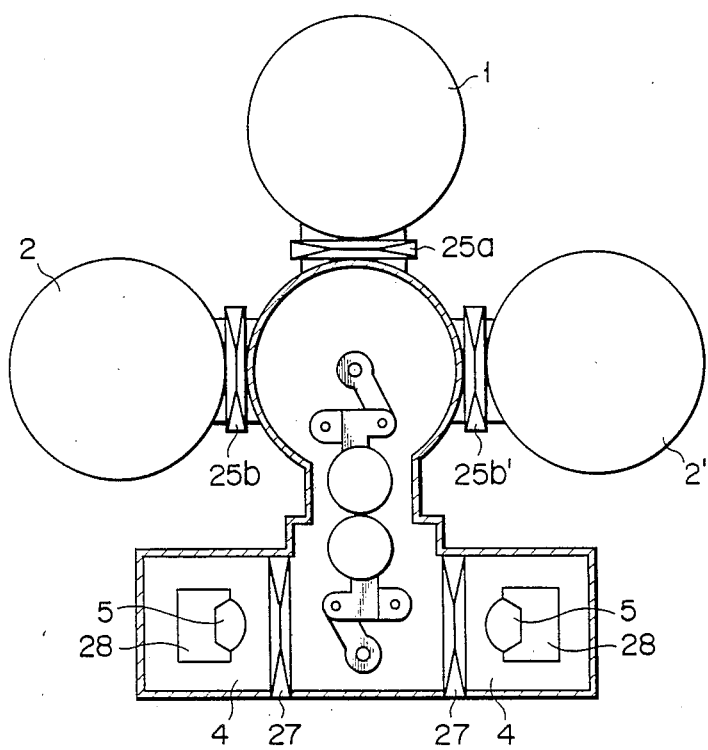
FIG. 7 is a sectional view showing a modification of the apparatus shown in FIG. 1.

As shown in FIG. 6A, a thermal oxide film 32 (thickness: 100 Å) serving as a gate insulating film is formed on the surface of a p-type Si wafer 31, as shown in FIG. 6B, and an n-type polycrystalline silicon 33 (thickness: 1,500 Å) is formed in the third chamber 2' of the apparatus shown in FIG. 7. Subsequently, the Si wafer 31 is transferred from the third chamber 2' to the transfer chamber 3 and then to the first chamber 1. Dry etching is performed in the first chamber 1, and a natural oxide film is removed from the surface of the polycrystalline silicon 33.

Figure 6C:
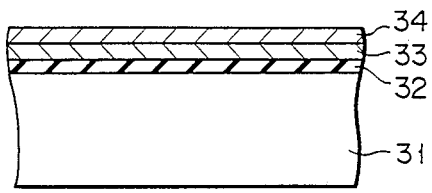
Figure 6D:
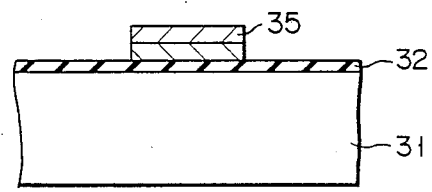

The Si wafer 31 is transferred from the first chamber 1 to the transfer chamber 3 and then to the second chamber 2. As shown in FIG. 6C, a tungsten silicide layer 34 (thickness: 1,500 Å) is formed by CVD in the second chamber 2. Thereafter, as shown in FIG. 6D, the polycrystalline silicon 33 and the tungsten silicide layer 34 are patterned, and a gate electrode 35 consisting of the polycrystalline silicon 33 and the tungsten silicide layer 34 is formed.

Figure 6E:
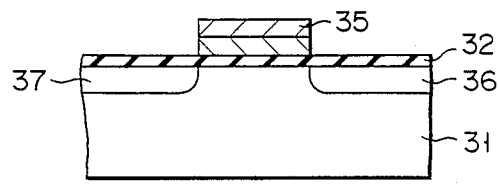
Figure 6F:
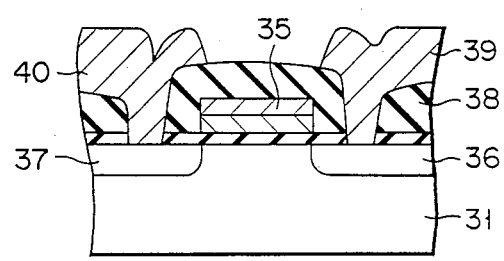

As ions are implanted in the resultant structure using the gate electrode 35 as a mask, and the resultant structure is annealed. As shown in FIG. 6E, source and drain regions 36 and 37 are formed, and an insulating interlayer 38 is formed on the entire surface of the resultant structure. Thereafter, contact holes are formed in the thermal oxide film 32 and the insulating interlayer 38 on the source and drain regions 36 and 37, and a conductive material is deposited and patterned on the entire surface of the resultant structure. As shown in FIG. 6F, source and drain electrodes 39 and 40 are formed, thus manufacturing a MOS transistor.

Note that the continuous operation of etching and deposition of the present invention can be applied to formation of the source and drain electrodes 39 and 40 shown in FIG. 6F by using the apparatus shown in FIG. 1. That is, after forming contact holes, dry etching is performed in the first chamber 1 to remove a natural oxide film from the exposed surface of the source and drain regions 36 and 37, and a conductive material is deposited by CVD in the second chamber 2. In this case, W may be selectively deposited only in contact holes, and an interconnection layer of Al may be formed.

As described above, according to this embodiment, when a natural oxide film is removed from a substrate to be treated such as a semiconductor wafer and a refractory metal is formed on the substrate to be treated, a treatment chamber for removing a natural oxide film and a treatment chamber for forming a film are independently arranged. In this case, since a wafer is transferred in a vacuum, the wafer is not exposed to the air. As a result, an adverse influence of a natural oxide film is prevented, and a film forming treatment can be accurately performed.

In addition, since each treatment can be performed in an exclusive treatment chamber, a countermeasure against contamination of a heavy metal can be realized, thereby performing a further accurate treatment.

The present invention is not limited to the above described embodiment, and two or three or more treatment chambers may be used.

As a substrate to be treated, not only a semiconductor wafer but an LCD substrate used in a liquid crystal TV or the like may be used.

As a film to be etched, not only a natural film ($SiO_2$) formed on a semiconductor wafer but an artificial $SiO_2$ film may be used, and other oxide films may be used.

An etching treatment is not limited to plasma etching, and any other etching treatments using excited etching gases may be used.

A treatment for forming a film after completion of the etching treatment is not limited to the above embodiment, and for example, a plasma CVD treatment may be used.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method of forming a conductive layer, comprising the steps of:
    performing dry etching of a surface of a substrate in a first chamber maintained in a nonoxidizing atmosphere, using a gas mixture of an $N_2$ gas and an $NF_3$ gas, to remove a natural oxide from said surface of said substrate;
    transferring said substrate from said first chamber to a second chamber while the nonoxidizing atmosphere is maintained; and
    forming a conductive layer consisting essentially of a refractory metal on said surface of said substrate by low-pressure CVD in said second chamber.

2. A method according to claim 1, wherein said dry etching is chemical dry etching using a plasma.

3. A method according to claim 1, wherein said refractory metal is tungsten.

4. A method according to claim 3, wherein said low-pressure CVD comprises the step of heating said substrate and supplying a $WF_6$ gas and an $SiH_4$ gas to said second chamber.

5. A method for forming a gate electrode of a MOS type semiconductor device, comprising the steps of:
    forming a gate oxide film on a surface of a semiconductor substrate;
    forming a polycrystalline silicon layer on said gate oxide film;
    performing dry etching of said surface of said polycrystalline silicon layer in a first chamber maintained in a nonoxidizing atmosphere, using a gas mixture of an $N_2$ gas and an $NF_3$ gas, to remove a natural oxide from said surface of said polycrystalline silicon layer;
    transferring said substrate from said first chamber to a second chamber while the nonoxidizing atmosphere is maintained;

forming a refractory metal layer on said surface of said polycrystalline silicon layer by low-pressure CVD in said second chamber; and patterning said polycrystalline silicon layer and said refractory metal layer to form a gate electrode consisting essentially of said polycrystalline silicon layer and said refractory metal layer.

6. A method according to claim 5, wherein said dry etching is chemical dry etching using a plasma.

7. A method according to claim 5, wherein said low-pressure CVD comprises the step of heating said substrate and supplying a $WF_6$ gas and an $SiH_4$ gas to said second chamber.

8. A method for forming source and drain electrodes of a MOS type semiconductor device, comprising the steps of:

forming a gate oxide film and a gate electrode on a surface of a semiconductor substrate;

forming source and drain regions by doping an impurity in said semiconductor substrate;

performing dry etching of surfaces of said source and drain regions in a first chamber maintained in a nonoxidizing atmosphere, using a gas mixture of an $N_2$ gas and an $NF_3$ gas, to remove a natural oxide from said surfaces of said source and drain regions;

transferring said substrate from said first chamber to a second chamber while the nonoxidizing atmosphere is maintained; and depositing a refractory metal on said surfaces of said source and drain regions by low-pressure CVD in said second chamber.

9. A method according to claim 8, wherein said dry etching is chemical dry etching using a plasma.

* * * * *